(12) United States Patent
Kuo

(10) Patent No.: US 12,334,002 B2
(45) Date of Patent: *Jun. 17, 2025

(54) DISPLAY DEVICE

(71) Applicant: InnoLux Corporation, Miao-Li County (TW)

(72) Inventor: Shu-Ming Kuo, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/632,308

(22) Filed: Apr. 11, 2024

(65) Prior Publication Data
US 2024/0274067 A1 Aug. 15, 2024

Related U.S. Application Data

(63) Continuation of application No. 18/090,497, filed on Dec. 29, 2022, now Pat. No. 11,978,390.

(30) Foreign Application Priority Data

Jan. 27, 2022 (CN) .......................... 202210102293.9

(51) Int. Cl.
*G09G 3/32* (2016.01)
*H01L 25/16* (2023.01)

(52) U.S. Cl.
CPC ............. *G09G 3/32* (2013.01); *H01L 25/167* (2013.01)

(58) Field of Classification Search
CPC . H01L 25/167; H01L 27/156; H01L 25/0753; G09G 3/32; G09G 2300/0452; G09G 2300/0426; G09G 2356/00; G06F 3/1446; G09F 9/33; G09F 9/302; H10K 59/18; H10K 59/352; H10K 59/353
See application file for complete search history.

(56) References Cited

U.S. PATENT DOCUMENTS

| | | | |
|---|---|---|---|
| 2015/0097837 A1* | 4/2015 | Jepsen | G06F 3/1446 345/428 |
| 2016/0093244 A1* | 3/2016 | Kazmierski | G06F 3/1446 345/1.3 |
| 2017/0169779 A1* | 6/2017 | Song | G02F 1/133512 |
| 2018/0122288 A1* | 5/2018 | Huang | G06F 3/1446 |

* cited by examiner

*Primary Examiner* — Muhammad N Edun
(74) *Attorney, Agent, or Firm* — Winston Hsu

(57) ABSTRACT

A display device includes a substrate having an edge extending along a first direction, a first group of a plurality of light emitting units including a first light emitting unit having a first color and a second light emitting unit having a second color, and a second group of a plurality of light emitting units including a first light emitting unit having the first color and a second light emitting unit having the second color. A distance between the first light emitting unit in the first group and the edge is less than a distance between the first light emitting unit in the second group and the edge along the second direction. A width of the first light emitting unit in the first group is less than a width of the first light emitting unit in the second group along the second direction.

8 Claims, 8 Drawing Sheets

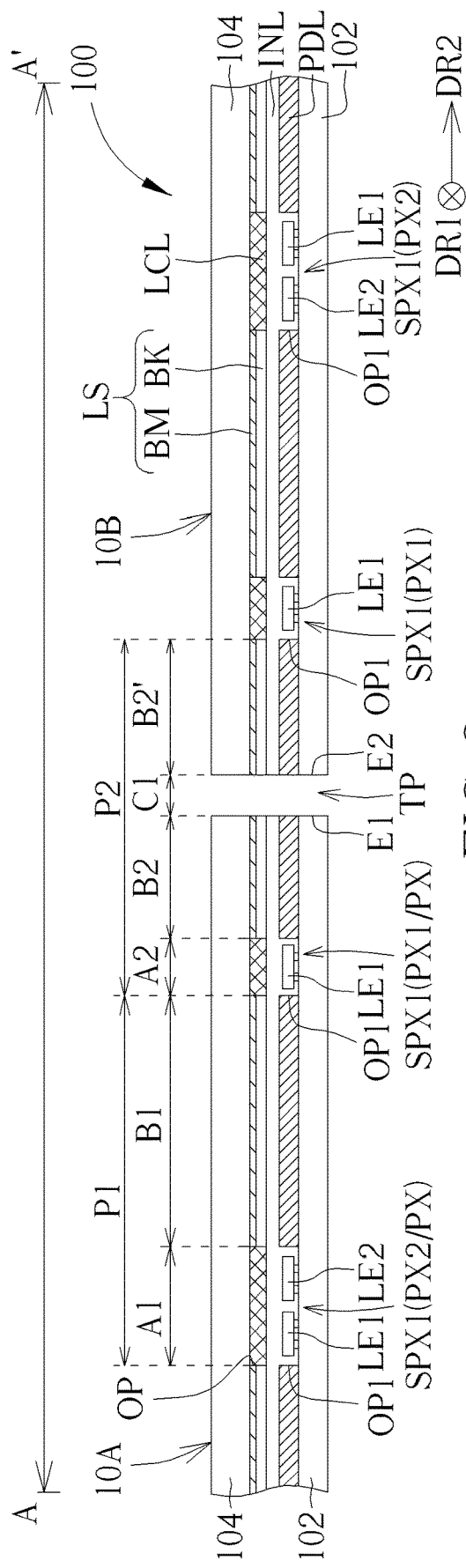
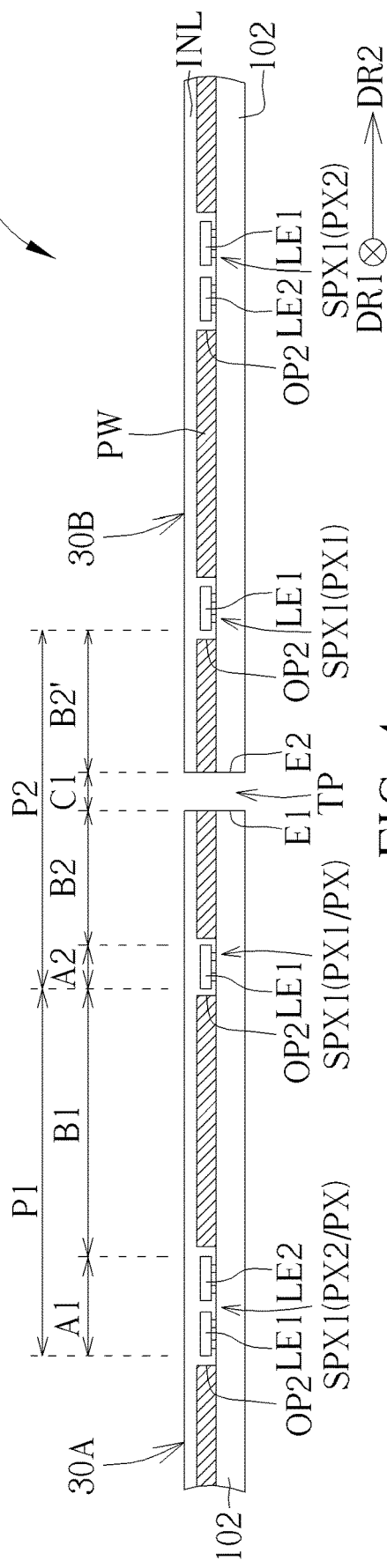
FIG. 3
FIG. 4

DISPLAY DEVICE

CROSS REFERENCE TO RELATED APPLICATIONS

This application is a continuation application of U.S. application Ser. No. 18/090,497, filed on Dec. 29, 2022. The content of the application is incorporated herein by reference.

BACKGROUND OF THE DISCLOSURE

1. Field of the Disclosure

The present disclosure relates to a display device, and more particularly to a display device having arrangement designs of pixels.

2. Description of the Prior Art

In current tiled electronic devices, defects such as bright lines or dark lines may occur at the seams between adjacent electronic devices, which affect the display performance. Therefore, to improve the display performance of the tiled electronic device is one of the important issues in this field.

SUMMARY OF THE DISCLOSURE

In some embodiments, a display device is provided by the present disclosure. The display device includes a substrate having an edge extending along a first direction, a first group of a plurality of light emitting units disposed on the substrate, and a second group of a plurality of light emitting units disposed on the substrate. The first group of the plurality of light emitting units include a first light emitting unit and a second light emitting unit arranged along the first direction, wherein the first light emitting unit in the first group has a first color, and the second light emitting unit in the first group has a second color different from the first color. The second group of the plurality of light emitting units include a first light emitting unit and a second light emitting unit arranged along the first direction, wherein the first light emitting unit in the second group has the first color, and the second light emitting unit in the second group has the second color. A distance between the first light emitting unit in the first group and the edge is less than a distance between the first light emitting unit in the second group and the edge along the second direction. A width of the first light emitting unit in the first group is less than a width of the first light emitting unit in the second group along the second direction.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 3 schematically illustrates a partial cross-sectional view of the electronic device according to the first embodiment of the present disclosure.

FIG. 4 schematically illustrates a partial cross-sectional view of an electronic device according to a third embodiment of the present disclosure.

DETAILED DESCRIPTION

Figure 1:
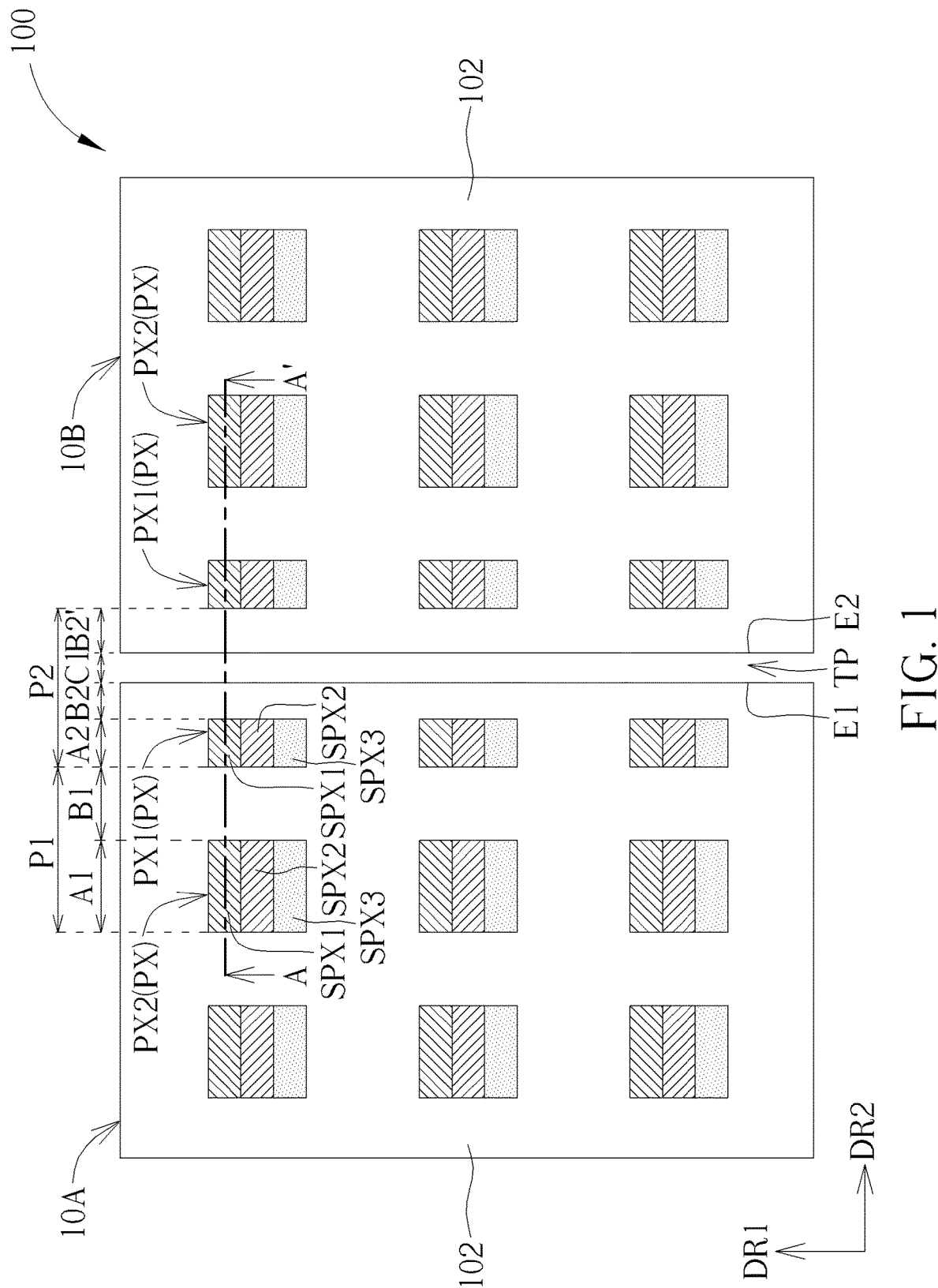
FIG. 1 schematically illustrates a top view of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. When an element or a layer is referred to as being "electrically connected" to another element or layer, it can be a direct electrical connection or an indirect electrical connection. The electrical connection or coupling described in the present disclosure may refer to a direct connection or an indirect connection. In the case of a direct connection, the ends of the elements on two circuits are directly connected or connected to each other by a conductor segment. In the case of an indirect connection, switches, diodes, capacitors, inductors, resistors, other suitable elements or combinations of the above elements may be included between the ends of the elements on two circuits, but not limited thereto.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

According to the present disclosure, the thickness, length and width may be measured through optical microscope, and the thickness or width may be measured through the cross-sectional view in the electron microscope, but not limited thereto.

In addition, any two values or directions used for comparison may have certain errors. In addition, the terms "equal to", "equal", "the same", "approximately" or "substantially" are generally interpreted as being within ±20%, ±10%, ±5%, ±3%, ±2%, ±1%, or ±0.5% of the given value.

If a first direction is said to be perpendicular to a second direction, the included angle between the first direction and the second direction may be located between 80 to 100 degrees. If a first direction is said to be parallel to a second direction, the included angle between the first direction and the second direction may be located between 0 to 10 degrees.

Unless it is additionally defined, all terms (including technical and scientific terms) used herein have the same meaning as commonly understood by those ordinary skilled in the art. It can be understood that these terms that are defined in commonly used dictionaries should be interpreted as having meanings consistent with the relevant art and the background or content of the present disclosure, and should not be interpreted in an idealized or overly formal manner, unless it is specifically defined in the embodiments of the present disclosure.

In the present disclosure, an electronic device may include a display device, a backlight device, an antenna device, a sensing device or a tiled device, but not limited thereto. The electronic device may be a foldable electronic device or a flexible electronic device. The display device may be a non-self-luminous display device or a self-luminous display device. The antenna device may be a liquid crystal antenna device or a non-liquid crystal antenna device, and the sensing device may be a device capable of detecting capacitance, light, heat or ultrasound, but not limited thereto. The tiled device may for example be a tiled display device or a tiled antenna device, but not limited thereto. It should be noted that the electronic device may be combinations of the above-mentioned devices, but not limited thereto. For example, the electronic device of the present disclosure may include a display device, wherein the display device may serve as the tiling units of the tiled display device, but not limited thereto. The display device is taken as an example of the electronic device for describing the content of the present disclosure in the following, but the present disclosure is not limited thereto. The electronic device may for example include liquid crystal, quantum dot (QD), fluorescence, phosphor, other suitable materials or combinations of the above-mentioned materials. According to some embodiments, the electronic device may include electronic elements, wherein the electronic elements may include passive elements or active elements such as capacitor, resistor, inductor, diode, transistor or combinations of the above-mentioned elements, but not limited thereto. The light emitting unit may for example include organic light emitting diode (OLED), micro light emitting diode (micro LED, mini light emitting diode (mini LED) or quantum dot light emitting diode (QLED or QDLED), but not limited thereto. According to some embodiments, the electronic device may include a panel and/or a backlight module, wherein the panel may for example include a liquid crystal panel or self-luminous panels, but not limited thereto. It should be realized that the display device is taken as an example for describing the electronic device of the present disclosure in the following, but the present disclosure is not limited thereto.

Referring to FIG. 1, FIG. 1 schematically illustrates a top view of an electronic device according to a first embodiment of the present disclosure. The electronic device of the present embodiment may for example be a tiled display device, wherein the tiled display device may include a display device 10A and a display device 10B, but not limited thereto. The display device 10A may include a substrate 102 and a first pixel group disposed on the substrate 102, wherein the first pixel group includes a plurality of pixels PX. Similarly, the display device 10B may include the substrate 102 and a second pixel group disposed on the substrate 102, wherein the second pixel group includes a plurality of pixels PX. A pixel PX of the first pixel group may include a plurality of sub-pixels (such as the first sub-pixel SPX1, the second sub-pixel SPX2 and the third sub-pixel SPX3) arranged along a first direction DR1, and the sub-pixels may include light emitting units. Similarly, a pixel PX of the second pixel group may include a plurality of sub-pixels (such as the first sub-pixel SPX1, the second sub-pixel SPX2 and the third sub-pixel SPX3) arranged along the first direction DR1, and the sub-pixels may include light emitting units. In some embodiments, the light emitting units may include light emitting diodes (LED), organic light emitting diodes (OLED), quantum dot light emitting diodes (QLED) or other types of diodes. The light emitting diodes may for example include mini light emitting diodes (mini LED) or micro light emitting diodes (micro LED), but not limited thereto. Although it is not shown in FIG. 1, circuit layer (for example, including driving circuits) may be disposed on these substrates 102, such that the light emitting units may be electrically connected to the circuit layer, and the light emission of the light emitting units may be controlled through the driving circuits, but not limited thereto. In some embodiments, the sub-pixels (such as the first sub-pixel SPX1, the second sub-pixel SPX2 and the third sub-pixel SPX3) in each of the pixels PX may respectively include light emitting unit(s) and a portion of the circuit layer (such as the driving units, connecting pads of the light emitting unit(s), and the like, but not limited thereto) electrically connected to the light emitting unit(s). In some embodiments, the display device 10A and/or the display device 10B may optionally include other suitable elements or layers such as light converting layer, cover substrate, and the like, but not limited thereto.

The substrate 102 of the display device 10A may have an edge E1, wherein the edge E1 may extend along the first direction DR1, and an edge E2 of the display device 10B may extend along the first direction DR1. In addition, as shown in FIG. 1, the display device 10A and the display device 10B may for example be arranged along a second direction DR2, and the second direction DR2 may substantially be perpendicular to the first direction DR1. The edge E1 of the display device 10A may be adjacent to the edge E2 of the display device 10B so as to form the tiled display device 100. The structure of the tiled display device 100 shown in FIG. 1 is just exemplary, and the present discourse is not limited thereto. In some embodiments, the tiled display device 100 may include more display devices, and these display devices may be arranged along the first direction DR1 and/or the second direction DR2, but not limited thereto.

As shown in FIG. 1, the display device 10A includes a plurality of pixels PX, wherein the plurality of pixels PX may for example include a first pixel PX1 and a second pixel PX2, the first pixel PX1 may be the pixel PX that is closest to the edge E1, and the second pixel PX2 may be the pixel PX that is adjacent to the first pixel PX1. Similarly, the display device 10B includes a plurality of pixels PX, wherein the plurality of pixels PX may for example include the first pixel PX1 and the second pixel PX2, the first pixel PX1 may be the pixel PX that is closest to the edge E2, and the second pixel PX2 may be the pixel PX that is adjacent to the first pixel PX1. As shown in FIG. 1, the first pixel PX1 and the second pixel PX2 of the display device 10A may be arranged on the substrate 102 along a second direction DR2 perpendicular to the first direction DR1, that is, the arrangement direction of the first pixel PX1 and the second pixel PX2 may be substantially perpendicular to the extending direction of the edge E1, but not limited thereto. The first pixel PX1 and the second pixel PX2 of the display device 10B may be arranged on the substrate 102 along the second direction DR2 perpendicular to the first direction DR1. As shown in FIG. 1, each of the pixels PX (such as the first pixel PX1 and the second pixel PX2) in the display device 10A or the display device 10B may respectively include a plurality of sub-pixels arranged along the first direction DR1, such as a first sub-pixel SPX1, a second sub-pixel SPX2 and a third sub-pixel SPX3 arranged along the first direction DR1, but not limited thereto. In some embodiments, the first sub-pixel SPX1, the second sub-pixel SPX2 and/or the third sub-pixel SPX3 may respectively include light emitting units that emit lights of the same color, but not limited thereto. In some embodiments, the first sub-pixel SPX1, the second sub-pixel SPX2 and/or the third sub-pixel SPX3 may respectively include light emitting units that emit lights of different colors. For example, the first sub-pixel SPX1, the second sub-pixel SPX2 and/or the third sub-pixel SPX3 may include light emitting units respectively emitting red, blue and green lights in some embodiments, but not limited thereto. The light emitting units may emit lights of appropriate colors according to the demands. In some embodiments, the first sub-pixel SPX1, the second sub-pixel SPX2, and the third sub-pixel SPX3 may include light emitting units that emit lights of the same color (such as blue light or UV light), but not limited thereto. In such condition, different light conversion layers may be optionally disposed on these light emitting units, and the lights emitted from the light emitting units located in the first sub-pixel SPX1, the second sub-pixel SPX2 and the third sub-pixel SPX3 may be converted into lights of different colors, but not limited thereto. It should be noted that the structures of the pixel PX (for example, including the first pixel PX1 and the second pixel PX2) or the sub-pixel (for example, the first sub-pixel SPX1, the second sub-pixel SPX2 and the third sub-pixel SPX3) in the present embodiment is not limited to what is shown in FIG. 1. In some embodiments, the size of at least one of the first sub-pixel SPX1, the second sub-pixel SPX2 and/or the third sub-pixel SPX3 in the pixel PX may be different from the size of other sub-pixels. The size of the sub-pixels will be detailed later. In some embodiments, the structure of the display device 10B may be similar to or the same as the structure of the display device 10A, and will not be redundantly described.

It should be noted that when the user watches the tiled display device, it is easier to find defects such as bright lines or dark lines in the horizontal direction (such as the second direction DR2) of the line of sight. The defects may occur due to the fact that different sub-pixels in a single pixel are substantially arranged along the second direction DR2, but not limited thereto. According to the present embodiment (as shown in FIG. 1), since the first sub-pixel SPX1, the second sub-pixel SPX2 and the third sub-pixel SPX3 in a single pixel PX are adjusted to be substantially arranged along the first direction DR1 perpendicular to the second direction DR2, the condition that the defects such as bright lines or dark lines are observed by the user may be reduced.

In addition, as shown in FIG. 1, a pixel pitch may be included between two adjacent pixels (such as the first pixel PX1 and the second pixel PX2) in the second direction DR2. The pixel pitch may be defined as the distance between the same end (such as the left end, the middle or the right end) of two adjacent pixels PX in the second direction DR2. As shown in FIG. 1, the first pixel pitch P1 between the first pixel PX1 and the second pixel PX2 may for example be the distance between the left end of the first pixel PX1 and the left end of the second pixel PX2 in the second direction DR2, but not limited thereto. The tiled display device 100 may be formed by tiling at least two display devices (such as the display device 10A and the display device 10B), and a pixel pitch may be included between two adjacent pixels respectively located on different display devices. In detail, a second pixel pitch P2 may be included between the first pixel PX1 in the display device 10A and the first pixel PX1 in the display device 10B which are adjacent to each other, and the second pixel pitch P2 may be the pixel pitch that crosses the tiling position TP between the display device 10A and the display device 10B.

As shown in FIG. 1, in the display device 10A (or the display device 10B), the second pixel PX2 may have a width A1, and a distance B1 may be included between the second pixel PX2 and the first pixel PX1 in the second direction DR2. The above-mentioned first pixel pitch P1 may for example be the sum of the width A1 and the distance B1 (that is, P1=A1+B1). In another aspect, the first pixel PX1 may have a width A2 in the second direction DR2, and a distance B2 may be included between the first pixel PX1 and the edge E1 of the display device 10A in the second direction DR2. Similarly, a distance B2' may be included between the first pixel PX1 and the edge E2 of the display device 10B. It should be noted that the plurality of sub-pixels of the pixel PX shown in FIG. 1 may for example include the structures substantially having the same size in the second direction DR2, and the width A2 of the first pixel PX1 may be defined as the width of any one of the sub-pixels (such as the first sub-pixel SPX1, the second sub-pixel SPX2 or the third sub-pixel SPX3) of the first pixel PX1 in the second direction DR2. Similarly, the width A1 of the second pixel PX2 may be defined as the width of any one of the sub-pixels (such as the first sub-pixel SPX1, the second sub-pixel SPX2 or the third sub-pixel SPX3) of the second pixel PX2 in the second direction DR2, but not limited thereto. In the tiled display device 100, the tiling position TP between the display device 10A and the display device 10B may include a gap, wherein the gap may have a gap width C1 in the second direction DR2. In addition, the second pixel pitch P2 may for example be the sum of the width A2, the distance B2, the gap width C1 and the distance B2' (that is, P2=A2+B2+C1+B2'). In some embodiments, the distance B2 between the first pixel PX1 and the edge E1 of the display device 10A in the second direction DR2 may for example be the equal to or different from the distance B2' between the first pixel PX1 and the edge E2 of the display device 10B in the second direction DR2. It should be noted that in addition to the first pixel PX1 and the second pixel PX2, other pixels PX in the display device 10A (or the display device 10B) that are not closest to the edge (the edge for tiling the display devices) may for example have the same width A1 and the same distance B1 between the pixels PX as the second pixel PX2, but not limited thereto.

Figure 2:
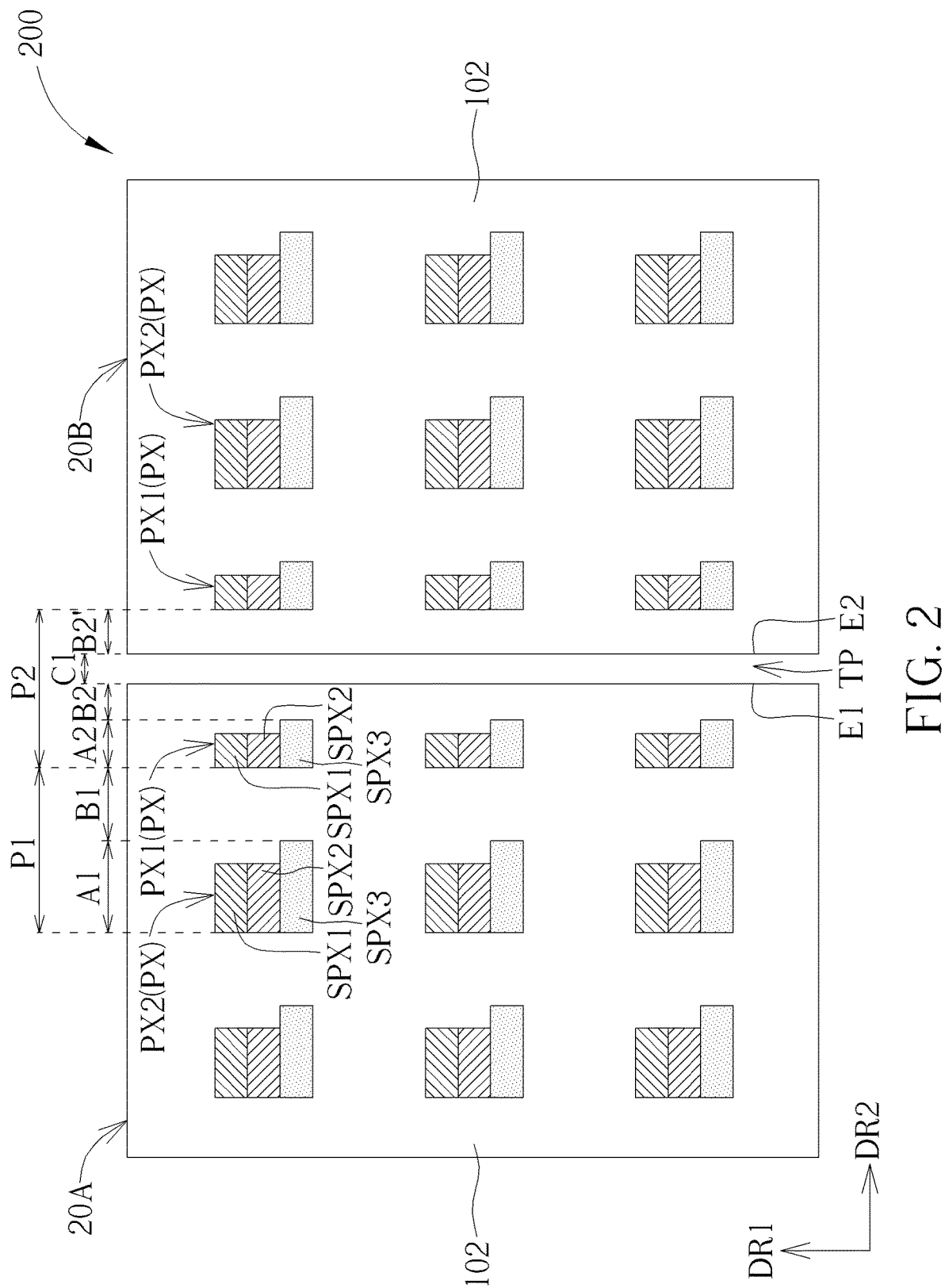
FIG. 2 schematically illustrates a top view of an electronic device according to a second embodiment of the present disclosure.

Referring to FIG. 2, FIG. 2 schematically illustrates a top view of an electronic device according to a second embodiment of the present disclosure. In the embodiment shown in FIG. 2, the sizes of at least two of the sub-pixels of a pixel PX (such as the first pixel PX1 and/or the second pixel PX2) of the display device 20A and/or the display device 20B of the tiled display device 200 may be different. For example, the widths of at least two of the sub-pixels of a pixel PX in the second direction DR2 may be different. For example, the width of the third sub-pixel SPX3 of the first pixel PX1 (or the second pixel PX2) in the second direction DR2 may for example be greater than the width of the first sub-pixel SPX1 and/or the second sub-pixel SPX2 of the first pixel PX1 (or the second pixel PX2) in the second direction DR2, but not limited thereto. When the widths of at least two sub-pixels of a pixel PX (such as the first pixel PX1 or the second pixel PX2) in the second direction DR2 are different, the width of the pixel PX in the second direction DR2 may be defined as the width of the sub-pixel of the pixel PX that has the maximum width in the second direction DR2. Taking the structure shown in FIG. 2 as an example, since the third sub-pixel SPX3 of the first pixel PX1 has the maximum width in the second direction DR2, the width A2 of the first pixel PX1 may for example be defined as the width of the third sub-pixel SPX3 of the first pixel PX1 in the second direction DR2. Similarly, since the third sub-pixel SPX3 of the second pixel PX2 has the maximum width in the second direction DR2, the width A1 of the second pixel PX2 may for example be defined as the width of the third sub-pixel SPX3 of the second pixel PX1 in the second direction DR2, but not limited thereto. After the width A2 of the first pixel PX1 and the width A1 of the second pixel PX2 are defined, the distance B1 between the first pixel PX1 and the second pixel PX2 and the distance B2 between the first pixel PX1 and the edge (such as the edge E1) may be defined. It should be noted that the distance B1 and the width A1 may respectively be measured on a straight line parallel to the second direction DR2, and the straight line may substantially pass through the width A1. As shown in FIG. 2, the distance B1 may be the distance between the third sub-pixel SPX3 of the first pixel PX1 and the third sub-pixel SPX3 of the second pixel PX2 in the second direction DR2, but not limited thereto. Similarly, the distance B2 and the width A2 may respectively be measured on a straight line parallel to the second direction DR2, and the straight line may substantially pass through the width A2. As shown in FIG. 2, the distance B2 may be the distance between the third sub-pixel SPX3 of the first pixel PX1 and the edge E1 in the second direction DR2. Similarly, the width A2 of the first pixel PX1, the width A1 of the second pixel PX2 and the distance B2' between the first pixel PX1 and the edge (such as the edge E2) in the display device 20B may be defined in similar ways, and will not be redundantly described. After the above-mentioned widths or distances are defined, the first pixel pitch P1 may be the sum of the width A1 and the distance B1, and the second pixel pitch P2 may be the sum of the width A2, the distance B2, the gap width C1 and the distance B2'. The definition of each size (such as the width) mentioned in the present embodiment may be applied to each of the embodiments of the present disclosure.

Referring to FIG. 1 and FIG. 2 again, the first pixel PX1 close to the edge E1 (or the edge E2) and the second pixel PX2 adjacent to the first pixel PX1 may have different sizes (such as the width) in the second direction DR2. Specifically, the width A2 of the first pixel PX1 may for example be less than the width A1 of the second pixel PX2 in the second direction DR2 (that is, A2<A1). In addition, the distance B2 between the first pixel PX1 and the edge E1 in the second direction DR2 may for example be less than the distance B1 between the first pixel PX1 and the second pixel PX2 in the second direction DR2 (that is, B2<B1), but not limited thereto. Through the above-mentioned design, the sum of the width A1 and the distance B1 (that is, the first pixel pitch P1) may be greater than the sum of the width A2 and the distance B2.

In some embodiments, the sum of the width A1 and the distance B1 (that is, the first pixel pitch P1) may be greater than the sum of the width A2, the distance B2 and the distance B2', but not limited thereto. Since the tiling position TP between the display device 20A and the display device 20B includes a gap width C1, the second pixel pitch P2 between the first pixel PX1 of the display device 20A and the first pixel PX1 of the display device 20B may approach the first pixel pitch P1 through the above-mentioned design. In detail, the second pixel pitch P2 between the first pixel PX1 of the display device 20A and the first pixel PX1 of the display device 20B may for example be the sum of the width A2, the distance B2, the distance B2' and the gap width C1. Therefore, by making the sum of the width A1 and the distance B1 (that is, the first pixel pitch P1) greater than the sum of the width A2, the distance B2 and the distance B2', the design of the gap width C1 may be flexible, and the second pixel pitch P2 may approach the first pixel pitch P1 to reduce defects such as bright lines or dark lines in the tiling position, thereby improving the display quality of the tiled display device 100. That is, in the tiled display device 100, the second pixel pitch P2 may be adjusted through the gap width C1, such that the second pixel pitch P2 and the first pixel pitch P1 are substantially equal. Therefore, the existence of the gap width C1 is more allowable in the tiled display device 100 comparing to conventional tiled display devices.

Figure 7:
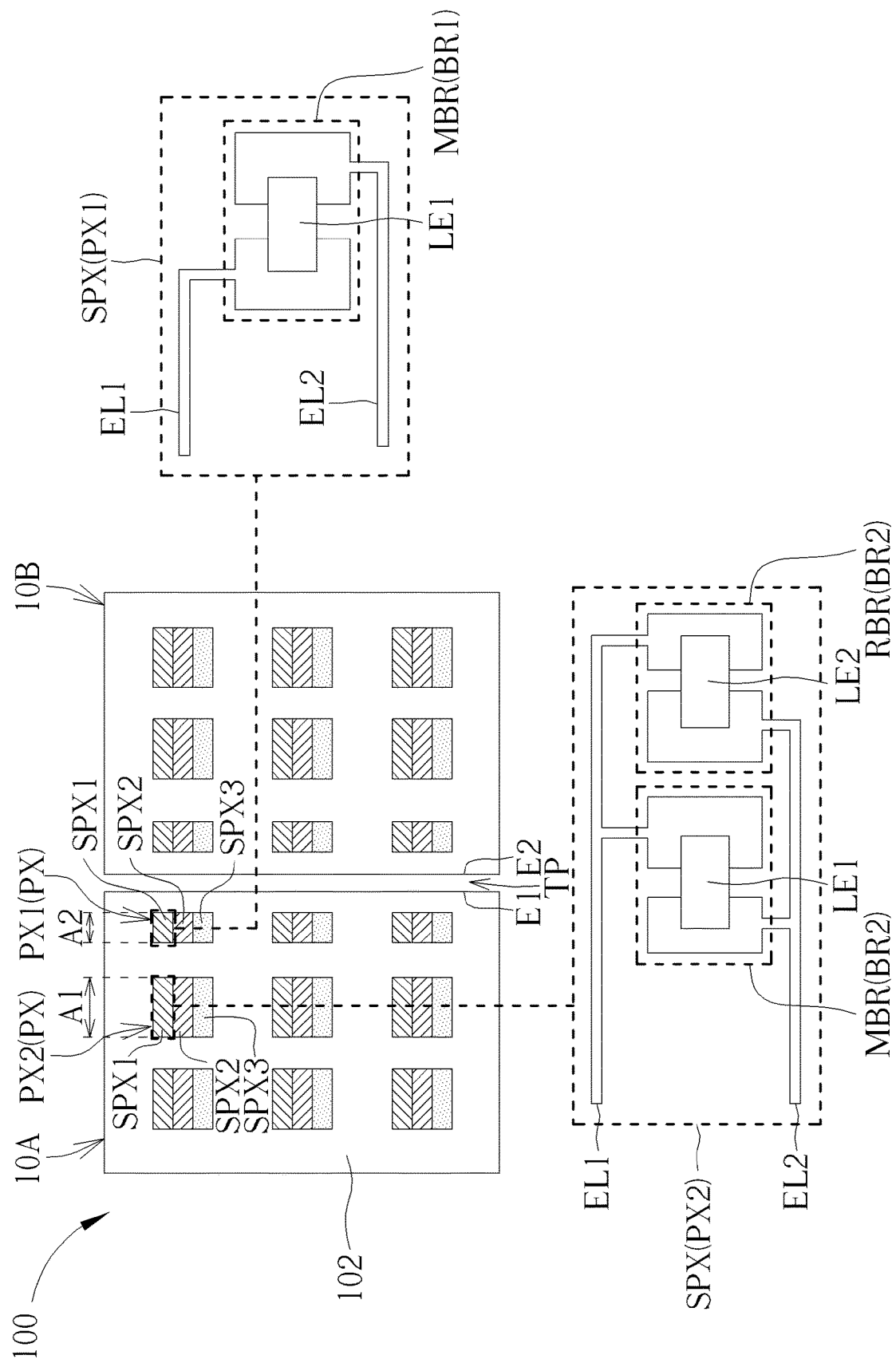
FIG. 7 schematically illustrates a partial enlarged view of the electronic device according to the first embodiment of the present disclosure.
Figure 8:
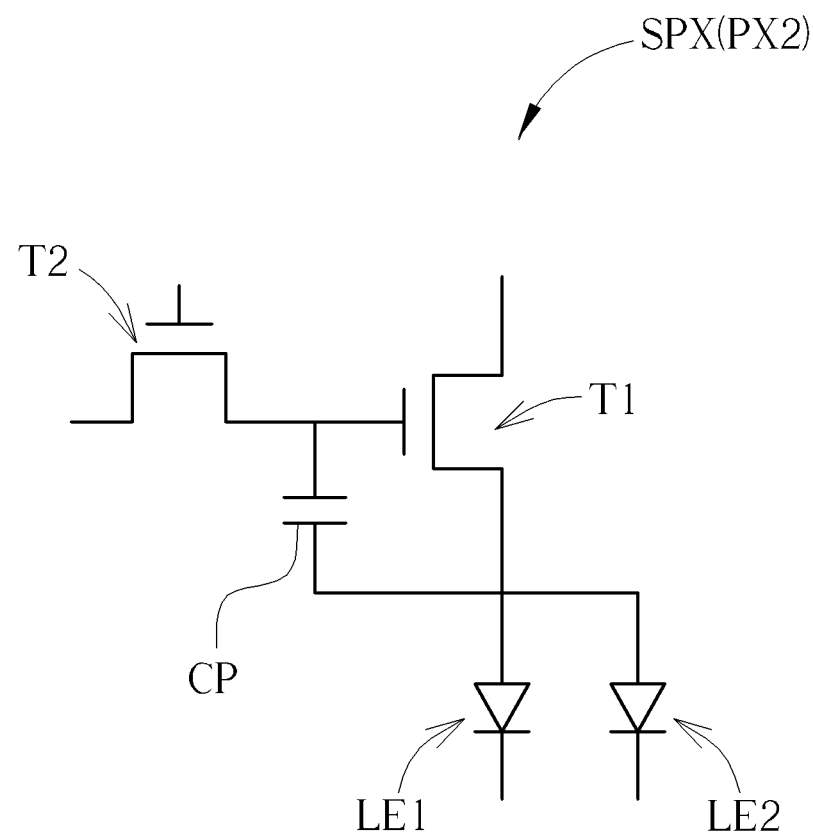
FIG. 8 schematically illustrates an equivalent circuit of a sub-pixel of a second pixel of the electronic device according to the first embodiment of the present disclosure.

Referring to FIG. 7 and FIG. 8, FIG. 7 schematically illustrates a partial enlarged view of the electronic device according to the first embodiment of the present disclosure, and FIG. 8 schematically illustrates an equivalent circuit of a sub-pixel of a second pixel of the electronic device according to the first embodiment of the present disclosure. According to the present embodiment, the width A2 of the first pixel PX1 and the width A1 of the second pixel PX2 may for example be different through the structural design of the sub-pixels. As shown in FIG. 7, the first pixels PX1 include a plurality of first bonding areas BR1 for bonding the light emitting units (such as the light emitting unit LE1), and the second pixels PX2 include a plurality of second bonding areas BR2 for bonding the light emitting units (such as the light emitting unit LE1 or the light emitting unit LE2), wherein the number of the second bonding areas BR2 may be greater than the number of the first bonding areas BR1, but not limited thereto. In some embodiments, one of the plurality of sub-pixels SPX of the first pixel PX1 includes a light emitting unit, such as the light emitting unit LE1. In some embodiments, one of the plurality of sub-pixels SPX of the second pixel PX2 includes two (or more) light emitting units.

In detail, a sub-pixel SPX of the first pixel PX1 shown in FIG. 7 may for example include a light emitting unit LE1, wherein the light emitting unit LE1 may be the main light emitting unit. In addition, a sub-pixel SPX of the second pixel PX2 may for example include two light emitting units, such as the light emitting unit LE1 and the light emitting unit LE2, wherein the light emitting unit LE1 may be the main light emitting unit, and the light emitting unit LE2 may be the spare light emitting unit. When the light emitting unit LE1 in the sub-pixel SPX of the second pixel PX2 or the circuit connected thereto is damaged, the light emitting unit LE2 may serve as a substitute light emitting unit. Compared with the sub-pixel SPX of the first pixel PX1, the sub-pixel SPX of the second pixel PX2 may include more light emitting units, such that each of the sub-pixels SPX of the second pixel PX2 may for example include more second bonding areas respectively, and these second bonding areas may be used for bonding the light emitting units respectively. As shown in FIG. 7, a sub-pixel SPX of the first pixel PX1 may for example include a first bonding area BR1, which is the main bonding area MBR, for bonding the light emitting unit LE1, but not limited thereto. In addition, a sub-pixel SPX of the second pixel PX2 may for example include two second bonding areas BR2, one of the second bonding areas BR2 may be the main bonding area MBR, and the other one of the second bonding areas BR2 may be the spare bonding area RBR, wherein the main bonding area MBR is used for bonding the light emitting unit LE1, and the spare bonding area RBR is used for bonding the light emitting unit LE2, but not limited thereto. In some embodiments, two electrodes (not shown) of the light emitting unit LE1 in the second pixel PX2 may be connected to a first line EL1 and a second line EL2 through the main bonding area MBR, and the first line EL1 and the second line EL2 are respectively used for transmitting different potential signal. Similarly, two electrodes (not shown) of the light emitting unit LE2 in the second pixel PX2 may optionally be connected to the first line EL1 and the second line EL2 through the spare bonding area RBR. Similarly, two electrodes (not shown) of the light emitting unit LE1 of the first pixel PX1 may be connected to the first line EL1 and the second line EL2 through the main bonding area MBR.

In some embodiments, the electrode of the light emitting unit LE1 (or the light emitting unit LE2) electrically connected to the first line EL1 may for example be the P-electrode, and the light emitting unit LE1 (or the light emitting unit LE2) electrically connected to the second line EL2 may for example be the N-electrode, but not limited thereto. As shown in FIG. 7 and FIG. 8, the light emitting unit LE1 and the light emitting unit LE2 in a sub-pixel SPX of the second pixel PX2 may for example be connected in parallel. FIG. 8 shows the circuit of the sub-pixel SPX of the second pixel PX2, wherein the sub-pixel SPX may for example include active elements or passive elements such as a transistor T1, a transistor T2 and/or a capacitor CP, and the like, but not limited thereto. The light emitting unit LE1 and the light emitting unit LE2 in a sub-pixel SPX may for example be connected in parallel, but not limited thereto.

As mentioned above, since a sub-pixel SPX of the first pixel PX1 includes the light emitting unit LE1 (the main light emitting unit) but not the light emitting unit LE2 (the spare light emitting unit), a sub-pixel SPX of the first pixel PX1 only includes a bonding area for bonding the light emitting unit LE1. Since the number of light emitting units in the sub-pixel SPX of the first pixel PX1 may be less than the number of light emitting units in the sub-pixel SPX of the second pixel PX2, the size of the first pixel PX1 may be less than the size of the second pixel PX2, or the width A2 of the first pixel PX1 may be less than the width A1 of the second pixel PX2 in the second direction DR2.

In addition, the structure of other pixels PX in the display device 10A (or the display device 10B), such as the pixels PX not close to the edge E1 (or the edge E2), may optionally be similar to the structure of the second pixel PX2 (for example, the number of the bonding areas or the number of the light emitting units may be equal), but not limited thereto. In the present embodiment, the design of the sub-pixels that makes the width A2 of the first pixel PX1 less than the width A1 of the second pixel PX2 is just exemplary, and the present disclosure is not limited thereto. In other embodiments, the width A2 of the first pixel PX1 in the second direction DR2 may be less than the width A1 of the second pixel PX2 in the second direction DR2 through any suitable design.

Referring to FIG. 3, FIG. 3 schematically illustrates a partial cross-sectional view of the electronic device according to the first embodiment of the present disclosure. Specifically, FIG. 3 shows a cross-sectional view of the structure shown in FIG. 1 along a line A-A'. FIG. 3 shows the structure of the first sub-pixels SPX1 of the first pixels PX1 and the second pixels PX2 in the display device 10A and the display device 10B. As shown in FIG. 3, the display device 10A (or the display device 10B) may optionally include a pixel defining layer PDL, a light converting layer LCL, a light shielding structure LS and/or a substrate 104, but not limited thereto. The pixel defining layer PDL may for example include a plurality of openings OP1, and the light emitting unit(s) in a sub-pixel SPX may for example be disposed in the opening OP1 of the pixel defining layer PDL. In other words, in the normal direction of the substrate 102, the light emitting unit(s) (such as the light emitting unit LE1 or the light emitting unit LE2) in a sub-pixel SPX may for example overlap the opening OP1. The pixel defining layer PDL may include any suitable insulating material, such as photoresist materials, light shielding materials, reflective materials or combinations of the above-mentioned materials. In some embodiments, the display device 10A and the display device 10B may respectively include a substrate 104 opposite to the substrate 102, and the light shielding structure LS may for example be disposed between the substrate 104 and the pixel defining layer PDL. In some embodiments, the light shielding structure LS may include a plurality of openings OP, and the openings OP may substantially define the position of the light converting layer LCL. In some embodiments, the light converting layer LCL may for example be disposed in the openings OP of the light shielding structure LS. In some embodiments, in the normal direction of the substrate 102, the light shielding structure LS is substantially overlapped with the pixel defining layer PDL. In other words, the openings OP of the light shielding structure LS may be substantially overlapped with the openings OP1 of the pixel defining layer PDL. In some embodiments, the size (such as the width) of the openings OP of the light shielding structure LS may be equal to or different from the size (such as the width) of the openings OP1 of the pixel defining layer PDL. In some embodiments, the light shielding structure LS may for example include a black matrix layer BM and/or a partition structure BK, but not limited thereto. In some embodiments, the black matrix layer BM may for example be located between the partition structure BK and the substrate 104, but not limited thereto. In some embodiments, the partition structure BK may include any suitable insulating material, such as photoresist materials, light shielding materials, reflective materials or combinations of the above-mentioned materials. In addition, in the normal direction of the substrate 104, the portions of the light converting layer LCL located in different openings OP of the light shielding structure LS may respectively overlap the light emitting units (such as the light emitting unit LE1 or the light emitting unit LE2) in the sub-pixels (such as the first sub-pixel SPX1, the second sub-pixel SPX2 and the third sub-pixel SPX3). In some embodiments, the light converting layer LCL may include color filter, quantum dot, phosphor, fluorescence, other suitable materials or combinations of the above-mentioned materials. The display device 10A (or the display device 10B) may include an insulating layer INL covering the light emitting units in different sub-pixels. The insulting layer INL may include any suitable insulating material. It should be noted that FIG. 3 just shows the structure of the first sub-pixel SPX1 as an example, and the structures of the second sub-pixel SPX2 or the third sub-pixel SPX3 may be similar to the structure of the first sub-pixel SPX1.

According to the embodiment shown in FIG. 3, the range (such as the width) of the sub-pixels (such as the first sub-pixel SPX1, the second sub-pixel SPX2 and the third sub-pixel SPX3) of the pixels (such as the first pixel PX1 and the second pixel PX2) may for example be defined through the openings OP of the light shielding structure LS. For example, as shown in FIG. 3, the width of a sub-pixel (such as the first sub-pixel SPX1) in the second direction DR2 may for example be defined by the opening OP of the light shielding structures LS that is overlapped with the sub-pixel. In the embodiment shown in FIG. 3, the first sub-pixel SPX1 is exemplarily shown, and the structures of the second sub-pixel SPX2 or the third sub-pixels SPX3 may be similar to the structure of the first sub-pixel SPX1. As shown in FIG. 3, the width A2 of the first pixel PX1 in the second direction DR2 and the width A1 of the second pixel PX2 in the second direction DR2 are for example regarded as the widths of the first sub-pixels SPX1 respectively, but the present embodiment is not limited thereto. In other embodiments (not shown), the width A2 of a first pixel PX1 may be defined by other sub-pixels having the maximum width in the first pixel PX1, and the width A1 of a second pixel PX2 may be defined by the sub-pixels having the maximum width in the second pixel PX2.

In addition, the distance B1 between a first pixel PX1 and a second pixel PX2 may be defined as the distance (or the pitch) between the opening OP of the light shielding structure LS overlapped with the first sub-pixel SPX1 of the first pixel PX1 and the opening OP of the light shielding structure LS overlapped with the first sub-pixel SPX1 of the second pixel PX2 in the second direction DR2, and the distance B2 between a first pixel PX1 and the edge E1 may be defined as the distance (or the pitch) between the opening OP of the light shielding structure LS overlapped with the first sub-pixel SPX1 of the first pixel PX1 and the edge E1 in the second direction DR2, but not limited thereto. The definitions of the width of the first pixel PX1 (not shown), the width of the second pixel PX2 (not shown), the distance between the first pixel PX1 and the second pixel PX2 (not shown) and the distance B2' between the first pixel PX1 and the edge E2 in the display device 10B may refer to the definitions mentioned above (in the display device 10A), and will not be redundantly described.

The structure of the tiled display device of the present disclosure is not limited to what is shown in FIG. 3, and the tiled display device can include any suitable structure according to the demands of design. The structural features of the display device and definitions of the sizes in other embodiments of the present disclosure will be described in the following. In order to simplify the description, the same elements or layers in the following embodiments would be labeled with the same symbol, and the features thereof will not be redundantly described. The differences between the embodiments will be detailed in the following.

Referring to FIG. 4, FIG. 4 schematically illustrates a partial cross-sectional view of an electronic device according to a third embodiment of the present disclosure. Specifically, FIG. 4 shows the structure of the first sub-pixels SPX1 of the first pixels PX1 and the second pixels PX2 in the display device 30A and the display device 30B. The tiled display device 300 of the present embodiment includes a display device 30A and/or a display device 30B, the display device 30A or the display device 30B may include the substrate 102, the pixels (such as the first pixel PX1, the second pixel PX2, and the like) disposed on the substrate 102, and a partition wall PW and an insulating layer INL1 disposed on the substrate 102, wherein the insulating layer INL1 may be disposed on the pixels PX (such as the first pixel PX1, the second pixel PX2, and the like) and the partition wall PW. The partition wall PW may include a plurality of openings OP2, and the openings OP2 of the partition wall PW may define the positions or ranges of the sub-pixels (such as the first sub-pixel SPX1, the second sub-pixel SPX2 and the third sub-pixel SPX3). In other words, the sub-pixels of the pixels (such as the first pixel PX1, the second pixel PX2, and the like) may for example be overlapped with the openings OP2 of the partition wall PW respectively, and these sub-pixels may be separated through the partition wall PW. In some embodiments, the partition wall PW may include any suitable insulating material. The partition wall PW may include any suitable light shielding material, reflective material, transmitting/transparent material or combinations of the above-mentioned materials. Although the partition wall PW is shown as a single layer in FIG. 4, the present embodiment is not limited thereto. The partition wall PW may include a multi-layer structure. For example, the partition wall PW may include a transparent layer and an absorbing material or a reflective material disposed at a periphery of the transparent layer, but not limited thereto. The insulating layer INL1 may include any suitable insulating material.

As shown in FIG. 4, since the display device 30A and/or the display device 30B may not include the substrate 104, the light converting layer LCL and/or the light shielding structure LS mentioned above, the width A2 of the first pixel PX1, the width A1 of the second pixel PX2, the distance B1 between the first pixel PX1 and the second pixel PX2 and the distance B2 between the first pixel PX1 and the edge E1 can be defined as follows. In FIG. 4, the first sub-pixel SPX1 is taken as an example to describe the definitions of the width A2 of the first pixel PX1 and the width A1 of the second pixel PX2, but the present embodiment is not limited thereto. In some embodiments, the width A2 of a first pixel PX1 and the width A1 of a second pixel PX2 may respectively be defined by the one of the sub-pixels of the first pixel PX1 and the second pixel PX2 having the maximum width. For example, as shown in FIG. 4, the first sub-pixel SPX1 of the second pixel PX2 may include the light emitting unit LE1 and the light emitting unit LE2, and the width A1 of the second pixel PX2 may be defined as the maximum distance between the boundary of the light emitting unit LE1 and the boundary of the light emitting unit LE2 of the first sub-pixel SPX1 in the second direction DR2. For example, the width A1 may be the distance between the left end of the light emitting unit LE1 and the right end of the light emitting unit LE2, but not limited thereto. The first sub-pixel SPX1 of the first pixel PX1 may include the light emitting unit LE1, and the width A2 of the first pixel PX1 may be defined as the distance between two boundaries of the light emitting unit LE1 of the first sub-pixel SPX1 in the second direction DR2. The distance B1 between the first pixel PX1 and the second pixel PX2 may be defined as the minimum distance between the light emitting unit(s) in the first sub-pixel SPX1 of the second pixel PX2 and the light emitting unit in the first sub-pixel SPX1 of the first pixel PX1 in the second direction DR2. For example, the distance B1 may be the distance between the right end of the light emitting unit LE2 of the first sub-pixel SPX1 of the second pixel PX2 and the left end of the light emitting unit LE1 of the first sub-pixel SPX1 of the first pixel PX1 in the second direction DR2. The distance B2 between the first pixel PX1 and the edge E1 may be defined as the minimum distance between the light emitting unit LE1 of the first sub-pixel SPX1 of the first pixel PX1 and the edge E1 in the second direction DR2. For example, the distance B2 may be the distance between the right end of the light emitting unit LE1 of the first sub-pixel SPX1 of the first pixel PX1 and the edge E1 in the second direction DR2. The definitions of the width of the first pixel PX1 (not shown), the width of the second pixel PX2 (not shown), the distance between the first pixel PX1 and the second pixel PX2 (not shown) and the distance B2' between the first pixel PX1 and the edge E2 may refer to the definitions mentioned above (in the display device 30A), and will not be redundantly described.

Figure 5:
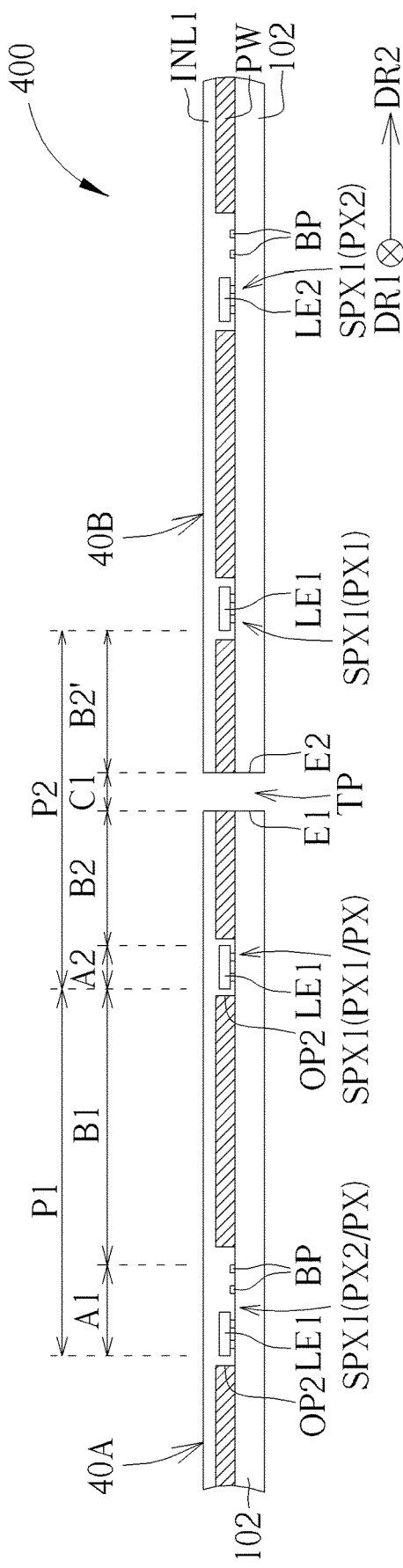
FIG. 5 schematically illustrates a partial cross-sectional view of an electronic device according to a fourth embodiment of the present disclosure.

Referring to FIG. 5, FIG. 5 schematically illustrates a partial cross-sectional view of an electronic device according to a fourth embodiment of the present disclosure. Specifically, FIG. 5 shows the structure of the first sub-pixels SPX1 of the first pixels PX1 and the second pixels PX2 in the display device 40A and the display device 40B. The sub-pixels (such as the first sub-pixel SPX1 shown in FIG. 5) of the second pixels PX2 in the display device 40A or the display device 40B of the tiled display device 400 of the present embodiment may include the light emitting unit LE1 and bonding pads BP that are not bonded to the light emitting unit. That is, the sub-pixels of the second pixel PX2 may not include the light emitting unit LE2 mentioned above, but a predetermined position (that is, the spare bonding area) of the above-mentioned light emitting unit LE2 may be reserved, and the bonding pads BP (that is, the spare bonding pad) may be disposed at the predetermined position. The bonding pads BP may include any suitable conductive material, such as metal materials or transparent conductive materials, but not limited thereto. The bonding pads BP at the predetermined position may be used for bonding the spare light emitting unit (that is, the light emitting unit LE2) in the subsequent repairing process of the pixel PX. In the present embodiment, since the first sub-pixel SPX1 of the second pixel PX2 may not include the light emitting unit LE2 but include the bonding pads BP at the predetermined position, the width A1 of the second pixel PX2 and the distance B1 between the first pixel PX1 and the second pixel PX2 may be defined by the bonding pads BP of the first sub-pixel SPX1 and the light emitting unit LE1, but not limited thereto. In FIG. 5, the first sub-pixel SPX1 is taken as an example to describe the definitions of the width A2 of the first pixel PX1 and the width A1 of the second pixel PX2, but the present embodiment is not limited thereto. In some embodiments, the width A2 of the first pixel PX1 and the width A1 of the second pixel PX2 may be defined by the one of the sub-pixels having the maximum width included in the first pixel PX1 and the second pixel PX2. As shown in FIG. 5, the width A1 of the second pixel PX2 may be defined as the maximum distance between the boundary of the light emitting unit LE1 and the boundary of the bonding pads BP in the second direction DR2. For example, the width A1 may be the distance between the left end of the light emitting unit LE1 and the right end of the bonding pads BP at the predetermined position, but not limited thereto. In addition, the distance B1 between the first pixel PX1 and the second pixel PX2 may be defined as the distance between the bonding pad BP and the light emitting unit LE1 of the first sub-pixel SPX1 of the first pixel PX1 in the second direction DR2. For example, the distance B1 may be the distance between the right end of the bonding pads BP and the left end of the light emitting unit LE1 of the first sub-pixel SPX1 of the first pixel PX1 in the second direction DR2, but not limited thereto.

The structure of the first sub-pixel SPX1 of the first pixel PX1 shown in FIG. 5 is similar to the structure in the above-mentioned embodiment shown in FIG. 4, so the definitions of the width A2 of the first pixel PX1 and the distance B2 may refer to the content in the above-mentioned embodiment shown in FIG. 4, and will not be redundantly described. The definitions of the width of the first pixel PX1 (not shown), the width of the second pixel PX2 (not shown), the distance between the first pixel PX1 and the second pixel PX2 (not shown), and the distance B2' between the first pixel PX1 and the edge E2 in the display device 40B may refer to the definitions in the display device 40A, which will not be redundantly described.

Figure 6:
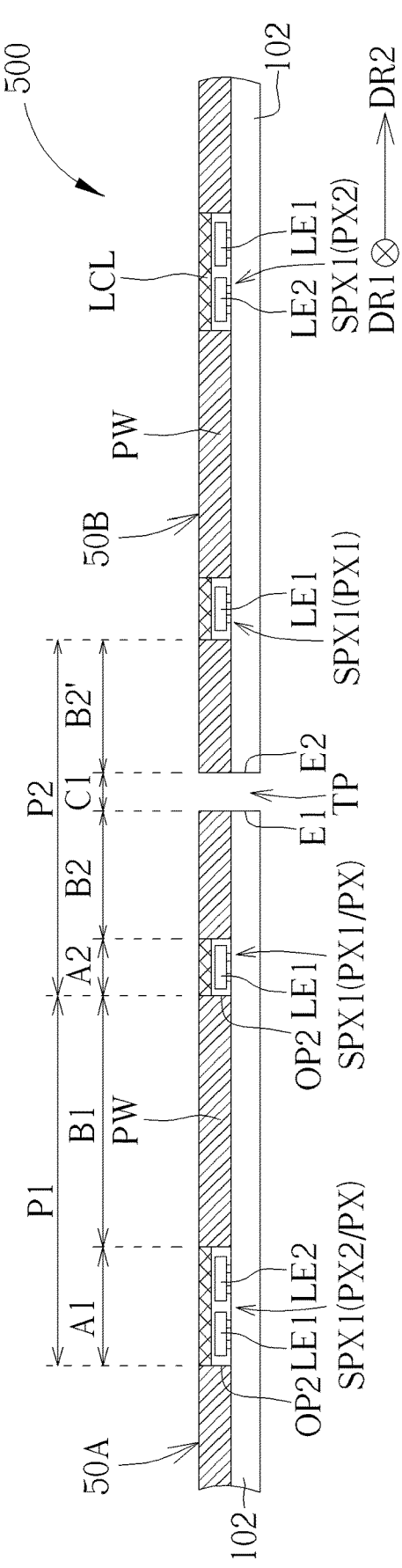
FIG. 6 schematically illustrates a partial cross-sectional view of an electronic device according to a fifth embodiment of the present disclosure.

Referring to FIG. 6, FIG. 6 schematically illustrates a partial cross-sectional view of an electronic device according to a fifth embodiment of the present disclosure. Specifically, FIG. 6 shows the structure of the first sub-pixels SPX1 of the first pixels PX1 and the second pixels PX2 in the display device 50A and the display device 50B. The main difference between the display device 50A and/or the display device 50B of the tiled display device 500 and the display device 30A and/or the display device 30B in the embodiment shown in FIG. 4 is that the light converting layer LCL is disposed on the light emitting unit (such as the light emitting unit LE1) in the first sub-pixel SPX1 of the first pixel PX1 in the display device 50A and/or the display device 50B, wherein the light converting layer LCL may substantially overlap the openings OP2 of the partition wall PW. Similarly, the light converting layer LCL is disposed on the light emitting units (such as the light emitting unit LE1 and the light emitting unit LE2) in the first sub-pixel SPX1 of the second pixel PX2, and the light converting layer LCL may substantially overlap other openings OP2 of the partition wall PW. Through the disposition of the above-mentioned light converting layer LCL, the color of the lights emitted from the light emitting units overlapped with the light converting layer LCL may be converted. The material of the light converting layer LCL may refer to the above-mentioned contents, and will not be redundantly described.

As shown in FIG. 6, the light converting layer LCL and the light emitting units in the sub-pixels overlapped with the light converting layer LCL may for example be disposed on the same substrate (that is, the substrate 102), and the display device 50A and/or the display device 50B may optionally not include the substrate 104 and/or the light shielding structure LS mentioned above. According to the present embodiment, the width A2 of the first pixel PX1 and the width A1 of the second pixel PX2 may be defined by the light converting layer LCL located on the sub-pixels (such as the first sub-pixel SPX1), but not limited thereto. In FIG. 6, the first sub-pixel SPX1 is taken as an example to describe the definitions of the width A2 of the first pixel PX1 and the width A1 of the second pixel PX2, but not limited thereto. In some embodiments, the width A2 of the first pixel PX1 and the width A1 of the second pixel PX2 may be defined by the one of the sub-pixels having the maximum width included in the first pixel PX1 and the second pixel PX2.

As shown in FIG. 6, the width A1 of a second pixel PX2 may be defined as the maximum width of the light converting layer LCL overlapped with the first sub-pixel SPX1 of the second pixel PX2 in the second direction DR2. The width A2 of a first pixel PX1 may be defined as the maximum width of the light converting layer LCL overlapped with the first sub-pixel SPX1 of the first pixel PX1 in the second direction DR2. The distance B1 between the first pixel PX1 (such as the first sub-pixel SPX1) and the second pixel PX2 (such as the first sub-pixel SPX1) may for example be defined as the distance between the light converting layer LCL overlapped with the first sub-pixel SPX1 of the first pixel PX1 and the light converting layer LCL overlapped with the first sub-pixel SPX1 of the second pixel PX2, and the distance B2 between the first pixel PX1 and the edge E1 may be defined as the distance between the light converting layer LCL overlapped with the first sub-pixel SPX1 of the first pixel PX1 and the edge E1 in the second direction DR2, but not limited thereto. The definitions of the width of the first pixel PX1 (not shown), the width of the second pixel PX2 (not shown), the distance between the first pixel PX1 and the second pixel PX2 (not shown), and the distance B2' between the first pixel PX1 and the edge E2 in the display device 50B may refer to the definitions in the display device 50A, which will not be redundantly described.

Figure 9:
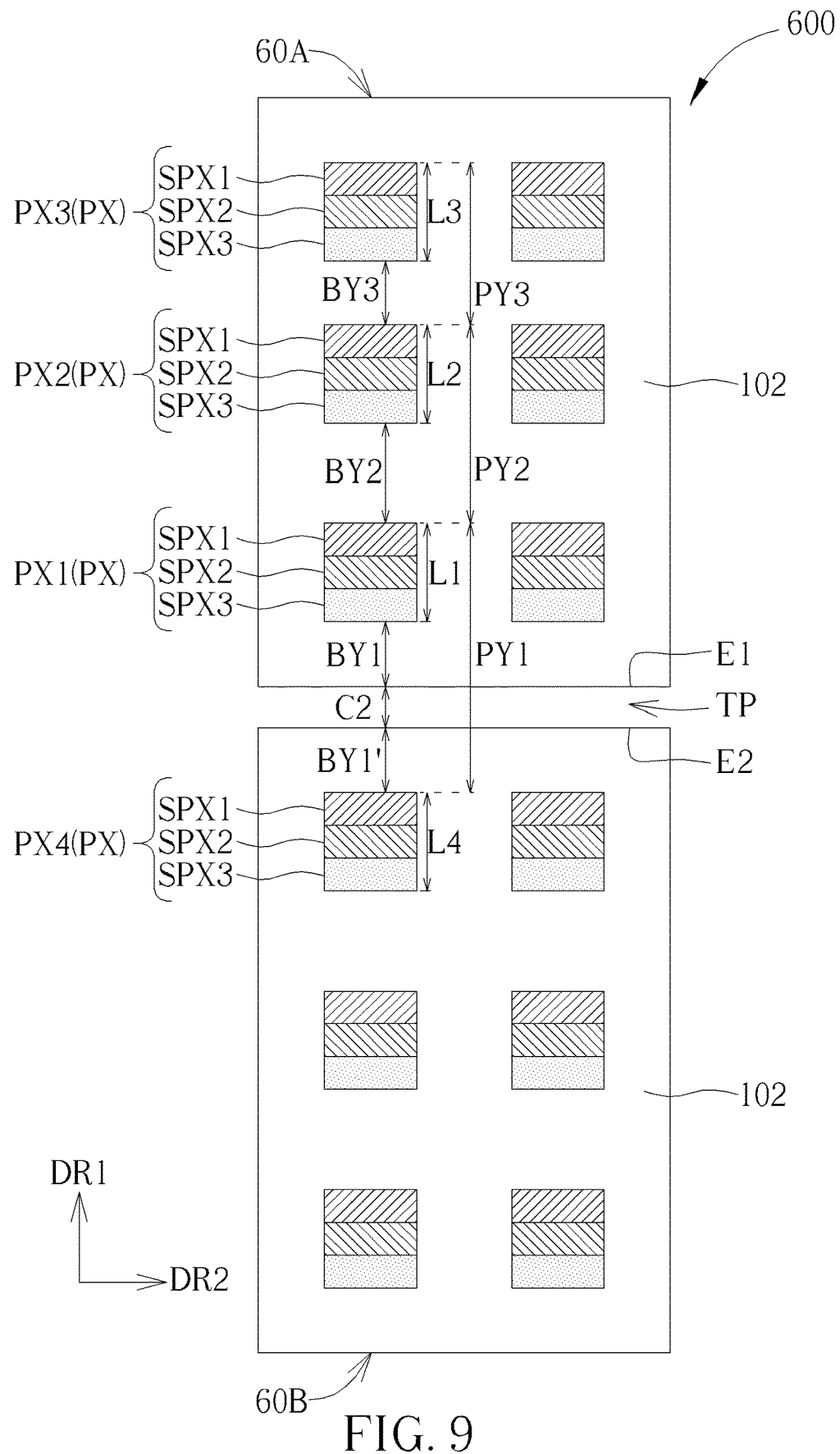
FIG. 9 schematically illustrates a top view of an electronic device according to a sixth embodiment of the present disclosure.

Referring to FIG. 9, FIG. 9 schematically illustrates a top view of an electronic device according to a sixth embodiment of the present disclosure. The tiled display device 600 may include a display device 60A and a display device 60B, but not limited thereto. As shown in FIG. 9, the display device 60A and the display device 60B may respectively include the substrate 102 and the pixel groups disposed on the substrate 102, wherein each of the pixel groups includes a plurality of pixels PX. The structural features of the substrate 102 and the pixels PX may refer to the above-mentioned contents, and will not be redundantly described. The substrate 102 of the display device 60A may include the edge E1, and the edge E1 may extend along the second direction DR2. The edge E1 of the display device 60A may be adjacent to other display devices (such as the display device 60B). In addition, the substrate 102 of the display device 60B may include the edge E2, the edge E2 may be adjacent to the edge E1 and extend along the second direction DR2, and the extending direction of the edge E2 may be substantially parallel to the extending direction of the edge E1. The substrate 102 of the display device 60A and the substrate 102 of the display device 60B may be arranged along the first direction DR1. It should be noted that the structure shown in FIG. 9 is just exemplary, and the present embodiment is not limited thereto. In some embodiments, the tiled display device may include more display devices.

According to the present embodiment, the pixel group in the display device 60A includes a plurality of pixels PX, and the plurality of pixels PX may for example include a first pixel PX1 closest to the edge E1, a second pixel PX2 adjacent to the first pixel PX1 and a third pixel PX3 adjacent to the second pixel PX2. The first pixel PX1, the second pixel PX2 and the third pixel PX3 may be arranged along the first direction DR1 perpendicular to the second direction DR2 in sequence, that is, the first pixel PX1, the second pixel PX2 and the third pixel PX3 may be arranged along the first direction DR1 perpendicular to the extending direction of the edge E1 in sequence. The pixel group in the display device 60B includes a plurality of pixels PX, and the plurality of pixels PX may for example include a fourth pixel PX4 closest to the edge E2, that is, the fourth pixel PX4 may be the pixel PX closest to the edge E2 (or the first pixel PX1). In the present embodiment, each of the pixels PX may include the plurality of sub-pixels, and these sub-pixels may be arranged along the first direction DR1. The pixels PX (such as the first pixel PX1, the second pixel PX2 and the third pixel PX3) may respectively include the plurality of sub-pixels arranged along the first direction DR1, such as the first sub-pixel SPX1, the second sub-pixel SPX2 and the third sub-pixel SPX3 arranged along the first direction DR1, but not limited thereto. The structural features of the sub-pixels may refer to the above-mentioned contents, and will not be redundantly described.

In the present embodiment, a pixel pitch may be included between adjacent two pixels in the first direction DR1, wherein the pixel pitch may be defined as the distance between the same ends of the two adjacent pixels PX in the first direction DR1. As shown in FIG. 9, the pixel pitch may for example be the distance between the upper end of a pixel PX and the upper end of another pixel PX adjacent to the pixel PX in the first direction DR1, but not limited thereto. In addition, since the tiled display device 600 is formed by tiling at least two display devices, the pixel pitch between the pixels respectively located at two opposite sides of the tiling position TP (that is, the pixel PX1 and the pixel PX4) may for example be adjusted according to the gap width C2 at the tiling position TP. In detail, a first pixel pitch PY1 may be included between the first pixel PX1 and the fourth pixel PX4, wherein the first pixel pitch PY1 may be the sum of the length of the first pixel PX1 in the first direction DR1 (such as the length L1), the distance BY1 between the first pixel PX1 and the edge E1 in the first direction DR1, the gap width C2 and the distance BY1' between the fourth pixel PX4 and the edge E2 in the first direction DR1 (that is, PY1=L1+BY1+C2+BY1'). In addition, a second pixel pitch PY2 may be included between the first pixel PX1 and the second pixel PX2, wherein the second pixel pitch PY2 may the sum of the length of the second pixel PX2 in the first direction DR1 (such as the length L2) and the distance BY2 between the second pixel PX2 and the first pixel PX1 in the first direction DR1 (that is, PY2=L2+BY2); a third pixel pitch PY3 may be included between the second pixel PX2 and the third pixel PX3, wherein the third pixel pitch PY3 may be the sum of the length of the third pixel PX3 in the first direction DR1 (such as the length L3) and the distance BY3 between the third pixel PX3 and the second pixel PX2 (that is, PY3=L3+BY3). In the present embodiment, the lengths of different pixels in the first direction DR1 may substantially be equal, that is, the length L1, the length L2 and the length L3 may substantially be equal, but not limited thereto. In some embodiments, the lengths of different pixels may be different. In some embodiments, the distance BY1 and the distance BY1' may be different.

According to some embodiments, the pixel pitch between pixels PX may for example vary as the distance from the tiling position TP of the tiled display device 600 increases. For example, the pixel pitches between the pixels in the display device 60A and/or the display device 60B may for example gradually decrease as the distance from the tiling position TP increases. The decrease is not limited to a proportional decrease. For example, in FIG. 9, the pitch (such as the first pixel pitch PY1) between the fourth pixel PX4 and the first pixel PX1 may be greater than the pitch (such as the second pixel pitch PY2) between the first pixel PX1 and the second pixel PX2, and the pitch (such as the second pixel pitch PY2) between the first pixel PX1 and the second pixel PX2 is greater than the pitch (such as the third pixel pitch PY3) between the second pixel PX2 and the third pixel PX3, but not limited thereto. Through the design of gradually decreasing the pixel pitches mentioned above, the possibility that the user observes the defects (for example, obvious seam) at the tiling position TP may be reduced, thereby improving the display effect of the tiled display device 600.

In the present embodiment, the distance BY1 between the first pixel PX1 and the edge E1 may be less than the distance BY2 between the second pixel PX2 and the first pixel PX1 and the distance BY3 between the third pixel PX3 and the second pixel PX2 in the first direction DR1, but not limited thereto. Through the above-mentioned design, the difference between the first pixel pitch PY1 and pixel pitches of other pixels may be reduced, thereby reducing the possibility that the user observes the defects at the tiling position TP. According to the present embodiment, in the first direction DR1, the length L2 of the second pixel PX2 and the length L3 of the third pixel PX3 may be similar to the length L1 of the first pixel PX1. Therefore, the distance BY2 between the second pixel PX2 and the first pixel PX1 may be greater than the distance BY3 between the third pixel PX3 and the second pixel PX2, such that the second pixel pitch PY2 may be greater than the third pixel pitch PY3, but not limited thereto. In conclusion, in the first direction DR1, the distance BY1 between the first pixel PX1 and the edge E1 may be less than the distance BY3 between the second pixel PX2 and the third pixel PX3, and the distance BY3 may be less than the distance BY2 between the first pixel PX1 and the second pixel PX2, but not limited thereto.

Figure 10:
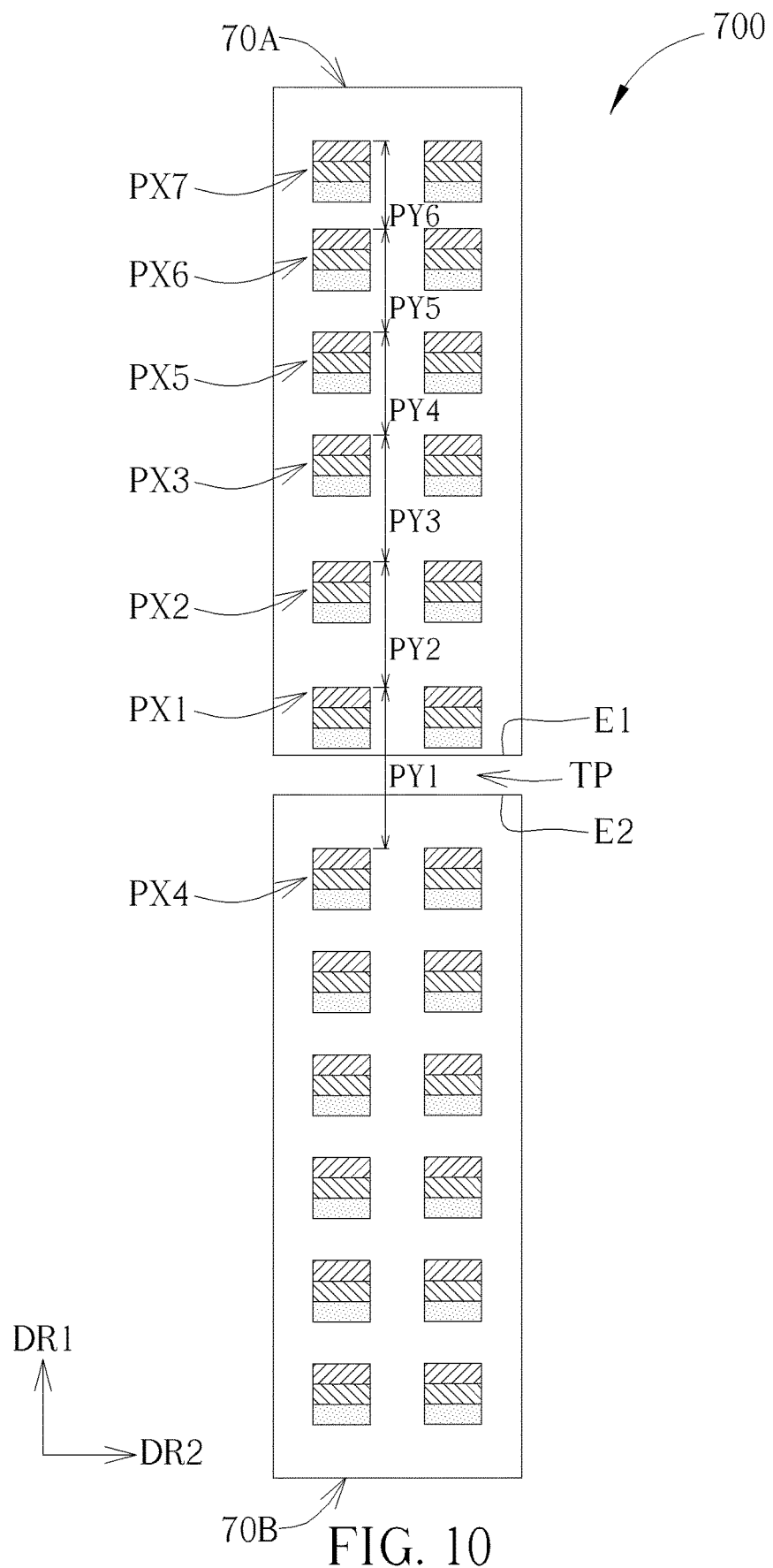
FIG. 10 schematically illustrates a top view of an electronic device according to a seventh embodiment of the present disclosure.

Referring to FIG. 10, FIG. 10 schematically illustrates a top view of an electronic device according to a seventh embodiment of the present disclosure. Compared with the structure shown in FIG. 9, FIG. 10 shows an embodiment of another variation of pixel pitches of the tiled display device. As shown in FIG. 10, the tiled display device 700 may be formed by tiling a display device 70A and a display device 70B, and the display device 70A includes a first pixel PX1, a second pixel PX2, a third pixel PX3, a fifth pixel PX5, a sixth pixel PX6 and a seventh pixel PX7 arranged along the first direction DR1 in sequence, but not limited thereto. The first pixel PX1 is the pixel closest to the edge E1, and the edge E1 is the edge adjacent to the display device 70B. The display device 70B includes a fourth pixel PX4 closest to the edge E2, and the edge E2 is the edge adjacent to display device 70A, but not limited thereto. In the first direction DR1, a first pixel pitch PY1 may be included between the first pixel PX1 and the fourth pixel PX4, a second pixel pitch PY2 may be included between the first pixel PX1 and the second pixel PX2, a third pixel pitch PY3 may be included between the second pixel PX2 and the third pixel PX3, a fourth pixel pitch PY4 may be included between the third pixel PX3 and the fifth pixel PX5, a fifth pixel pitch PY5 may be included between the fifth pixel PX5 and the sixth pixel PX6, and a sixth pixel pitch PY6 may be included between the sixth pixel PX6 and the seventh pixel PX7. In some embodiments, in the first direction DR1, the first pixel pitch PY1 may for example be greater than the second pixel pitch PY2, the second pixel pitch PY2 may substantially be equal to the third pixel pitch PY3, the third pixel pitch PY3 may be greater than the fourth pixel pitch PY4, the fourth pixel pitch PY4 may substantially be equal to the fifth pixel pitch PY5, and the fifth pixel pitch PY5 may be greater than the sixth pixel pitch PY6 (that is, PY1>PY2=PY3>PY4=PY5>PY6), but not limited thereto. Compared to the embodiment shown in FIG. 9, the pixel pitches may be gradually decreased in the present embodiment. It should be noted that the pixel pitches in the tiled display device of the present disclosure may have other suitable designs, which is not limited to what is shown in FIG. 9 and FIG. 10.

In summary, a display device and a tiled display device including the display device is provided by the present disclosure, wherein the sizes of the pixels and the distance between the pixels in the display device may be designed, so as to reduce the difference between the pixel pitch crossing the tiling position of the display device and other pixel pitches. Therefore, the possibility that the user observes the defects such as bright lines or dark lines at the tiling position of the tiled display device may be reduced. In addition, the seam at the tiling position is more allowable in the tiled display device of the present disclosure comparing to conventional tiled display devices, so the demands of precision for the cutting process or the grinding process of the panel may be lower, thereby simplifying the manufacturing process of the tiled display device or reducing production cost of the tiled display device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
    a substrate having an edge, wherein the edge extends along a first direction;
    a first group of a plurality of light emitting units disposed on the substrate, comprising a first light emitting unit and a second light emitting unit arranged along the first direction, wherein the first light emitting unit in the first group has a first color, and the second light emitting unit in the first group has a second color different from the first color; and
    a second group of a plurality of light emitting units disposed on the substrate, comprising a first light emitting unit and a second light emitting unit arranged along the first direction, wherein the first light emitting unit in the second group has the first color, and the second light emitting unit in the second group has the second color,
    wherein a distance between the first light emitting unit in the first group and the edge is less than a distance between the first light emitting unit in the second group and the edge along a second direction perpendicular to the first direction, wherein a width of the first light emitting unit in the first group is less than a width of the first light emitting unit in the second group along the second direction.

2. The display device of claim 1, wherein a width of the second light emitting unit in the first group is less than a width of the second light emitting unit in the second group along the second direction.

3. The display device of claim 1, wherein the width of the first light emitting unit in the second group is greater than a width of the second light emitting unit in the second group along the second direction.

4. The display device of claim 1, wherein the first color is blue, red, or green, and the second color is blue, red, or green.

5. The display device of claim 4, wherein the first color is blue.

6. The display device of claim 5, wherein the second color is red.

7. The display device of claim 1, wherein the plurality of light emitting units in the first group comprise organic light emitting diodes.

8. The display device of claim 7, wherein the plurality of light emitting units in the second group comprise organic light emitting diodes.

\* \* \* \* \*